(12) United States Patent
Tanaka (10) Patent No.: US 11,127,606 B1
(45) Date of Patent: Sep. 21, 2021

(54) COOLING STATION WITH INTEGRATED ISOLATION VALVES

(71) Applicant: Seagate Technology LLC, Cupertino, CA (US)

(72) Inventor: Samuel Lewis Tanaka, San Leandro, CA (US)

(73) Assignee: Seagate Technology LLC, Fremont, CA (US)

(*) Notice: Subject to any disclaimer, the term of this patent is extended or adjusted under 35 U.S.C. 154(b) by 261 days.

(21) Appl. No.: 16/046,051

(22) Filed: Jul. 26, 2018

(51) Int. Cl.
| | |
|---|---|
| *H01L 21/67* | (2006.01) |
| *C23C 16/46* | (2006.01) |
| *H01L 21/673* | (2006.01) |
| *C23C 16/455* | (2006.01) |

(52) U.S. Cl.
CPC .. *H01L 21/67109* (2013.01); *C23C 16/45517* (2013.01); *C23C 16/463* (2013.01); *C23C 16/466* (2013.01); *H01L 21/67376* (2013.01)

(58) Field of Classification Search
CPC .... C23C 14/00–5893; C23C 16/00–56; C23C 16/4411; C23C 16/45517; C23C 16/45519; C23C 16/45521; C23C 16/45544; C23C 16/45561; C23C 16/45565; C23C 16/45568; C23C 16/45572; C23C 16/45597; C23C 16/458; C23C 16/4587; C23C 16/463; C23C 16/466; H01L 21/67–68792; F28F 1/00; F28F 2280/105; H01J 37/32–3299; H01J 37/32431; H01J 37/3244; H01J 37/32513; H01J 37/32522; H01J 37/32568; H01J 37/32715; H01J 37/32724
See application file for complete search history.

(56) References Cited

U.S. PATENT DOCUMENTS

| | | | | |
|---|---|---|---|---|
| 4,273,427 A | * | 6/1981 | Bailey | G03B 23/00 353/27 A |
| 5,088,444 A | * | 2/1992 | Ohmine | H01L 21/67748 118/715 |
| 5,314,574 A | * | 5/1994 | Takahashi | H01L 21/02049 438/706 |
| 5,705,044 A | * | 1/1998 | Washburn | C23C 14/352 204/298.03 |
| 6,433,314 B1 | * | 8/2002 | Mandrekar | G05D 23/19 118/715 |
| 6,455,098 B2 | * | 9/2002 | Tran | H01L 21/67751 427/255.18 |

(Continued)

*Primary Examiner* — Gordon Baldwin
*Assistant Examiner* — Kurt Sweely
(74) *Attorney, Agent, or Firm* — Mueting Raasch Group (57) ABSTRACT

An apparatus comprises a chamber configured to receive a medium. The chamber comprises a first cooled structure having a first surface and a second cooled structure having a first surface. The first surface of the first cooled structure faces the first surface of the second cooled structure and is positioned a predetermined distance therefrom to form a gap, and the gap is configured to receive the medium. The chamber further includes a first gas inlet positioned proximate the center of the first cooled structure, a first slidable structure configured to seal a first side of the chamber when in a closed position, and a second slidable structure, positioned opposite the first slidable structure, and configured to seal a second side of the chamber when in a closed position.

19 Claims, 9 Drawing Sheets

(56) References Cited

U.S. PATENT DOCUMENTS

| | | | |
|---|---|---|---|
| 6,846,380 B2* | 1/2005 | Dickinson | B08B 3/04 |
| | | | 118/719 |
| 8,701,753 B2* | 4/2014 | Yi | H01L 21/67109 |
| | | | 118/724 |
| 2007/0158181 A1* | 7/2007 | Yi | C23C 14/0063 |
| | | | 204/192.12 |
| 2012/0223048 A1 | 9/2012 | Paranjpe et al. | |
| 2016/0035546 A1* | 2/2016 | Platt | C23C 16/50 |
| | | | 204/192.12 |

* cited by examiner

COOLING STATION WITH INTEGRATED ISOLATION VALVES

SUMMARY

Embodiments of the disclosure are directed to an apparatus comprising a chamber configured to receive a medium. The chamber includes a first cooled structure having a first surface and a second cooled structure having a first surface, wherein the first surface of the first cooled structure faces the first surface of the second cooled structure and is positioned a predetermined distance therefrom forming a gap. The gap is configured to receive the medium. The chamber further includes a first gas inlet positioned proximate the center of the first cooled structure, a first slidable structure configured to seal a first side of the chamber when in a closed position, a second slidable structure, positioned opposite the first slidable structure and configured to seal a second side of the chamber when in a closed position.

Further embodiments are directed to an apparatus comprising a first unit and a second unit. The first unit comprises a first cooling plate having a cooling surface, a first gas inlet, and a first slidable sealing structure adjacent the first cooling plate. The second unit comprises a second cooling plate having a cooling surface, a second gas inlet, and a second slidable sealing structure adjacent the second cooling plate. The second unit is configured as a mirror opposite of the first unit and the first and second units are statically positioned with the cooling surfaces facing each other a predetermined distance apart.

Additional embodiments are directed to a method for cooling a medium during fabrication. The method comprises receiving a medium in a gap between two stationary cooling plates in a cooling station chamber and closing first and second isolation valves to seal the chamber. Cooling gas is injected through at least one gas inlet proximate the center of at least one of the cooling plates toward the medium, and in response to cooling the medium, the injected gas is removed from the chamber.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification, the appended drawings are referenced wherein.

The figures are not necessarily to scale. Like numbers used in the figures refer to like components. However, the use of a number to refer to a component in a given figure is not intended to limit the component in another figure labeled with the same number.

DETAILED DESCRIPTION

Reliance on technology and big data continues to increase the need for data storage devices. A popular form of storage is the data storage disk, or recording medium. Data may be recorded on disks by various electronic, magnetic, optical, or mechanical changes to one or more layers of the recording medium. One form of electromagnetic recording, heat assisted magnetic recording (HAMR), is a technology that enables storage density in hard disk drives well beyond. 1 Tb/in$^2$. The recording process starts by heating a small region of the disk above Curie temperature ($T_c$) using a near field transducer. The region is subsequently cooled rapidly in the presence of a magnetic field from the recording head. The magnetic field sets the orientation of magnetization in the local region of heated media as it cools, thereby encoding a bit with data for storage. By reducing the local media anisotropy (K) at high temperature (e.g., above $T_c$), HAMR makes it possible to record data on high anisotropy material such as L10-FePt. The high anisotropy in L10-FePt extends the superparamagnetic limit faced with conventional magnetic recording, so that grain size can be further reduced to increase signal-to-noise ratio. However, the high anisotropy FePtX (X being an optional dopant) of HAMR media requires high temperature processing (e.g., above $T_c$) that presents a challenge to production of media with similar, or lower, roughness as compared to current, conventional perpendicular media.

Production of HAMR media involves multiple thin-film processing steps (e.g., as man y as 24 or more). Many of these thin-film deposition steps involve increased temperatures. A significant limitation in the unit per hour production rate for recording disks is the time it takes to cool each disk between certain processing steps, such as before a carbon overcoat layer is applied. To cool a medium as rapidly as possible, high gas pressure is utilized to facilitate heat transfer from the hot medium to cooling plates on either side of the medium. Previous cooling techniques have been unreliable and have had limitations on the achievable cooling rates due to the time involved in actuating cooling plates for the techniques. In embodiments described herein, a cooling station utilizes integrated isolation valves to seal the cooling chamber at a smaller volume than previous cooling stations along with injecting the cooling gas from a position central to one or both cooling plates. This provides faster cooling, as compared with previous techniques, by forcing the cooling gas out from the center of the disk (e.g., medium) and confining the gas locally around the disk with the isolation valves. This results in a decreased amount of time the medium spends within the cooling station. When the amount of time each disk is processed in the cooling station is decreased, the recording disk production rate is increased and the cost of HAMR media production is reduced.

Figure 1A:
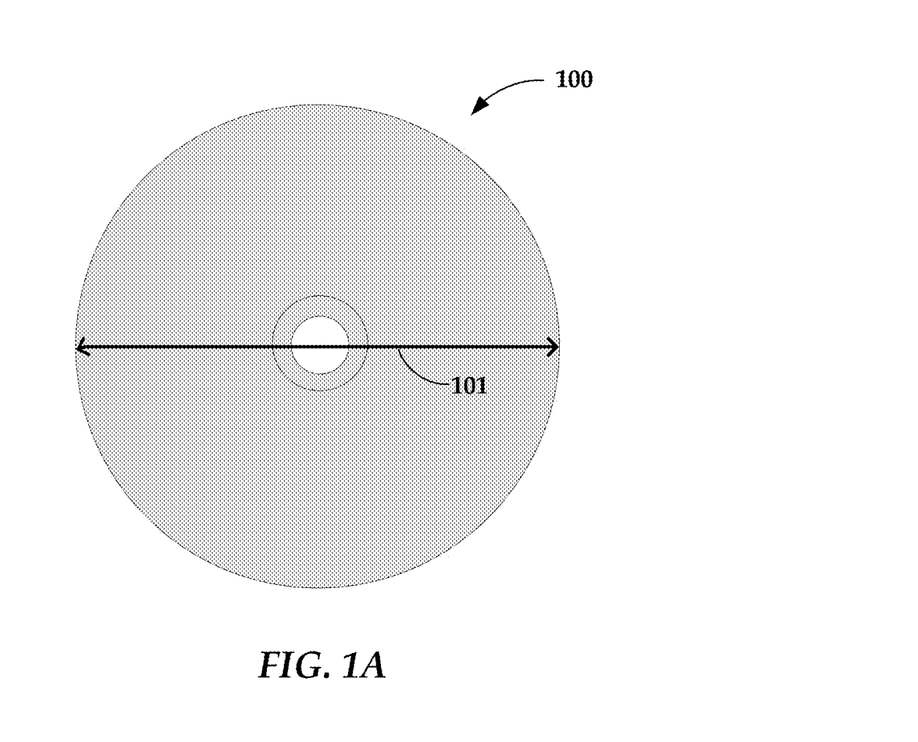
FIG. 1A is a top-down view of a recording medium according to embodiments discussed herein.

Turning to FIG. 1A, an example recording medium 100, or disk, is shown. Cooling stations described herein are configured to receive a recording medium 100, or disk, and those disks may be a variety of sizes. For example, recording media can have varying diameters 101, such as, 95 mm, 84 mm, 70 mm, 65 mm, 27 mm, and 21 mm, to fit varying device form factors. While the recording medium 100 is illustrated as a circular disk, the medium could take a variety of shapes.

Figure 1B:
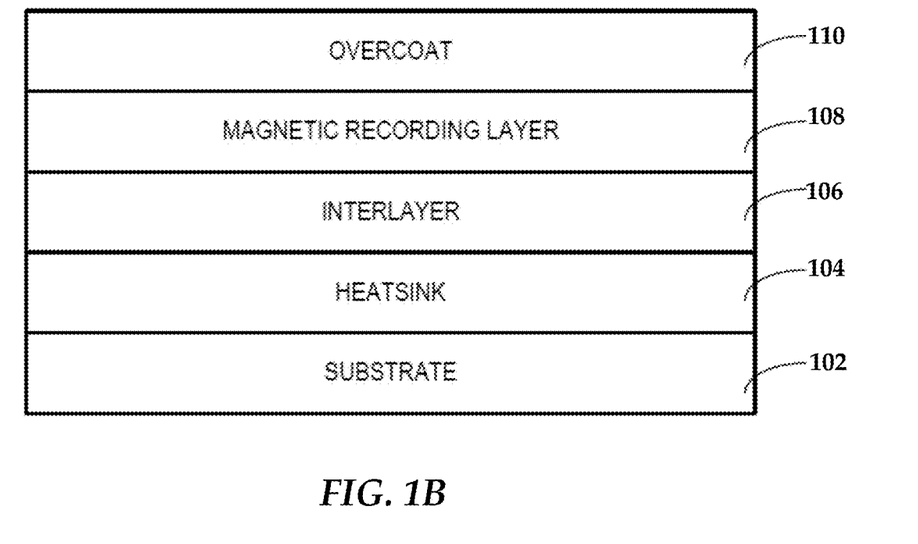
FIG. 1B is a cross-sectional view of a recording medium according to embodiments discussed herein.

In FIG. 1B, a cross-sectional view illustrates example thin-film layers that comprise the recording medium 100. A recording medium 100, such as a HAMR medium, can include a substrate 102, at least one heatsink layer 104, an interlayer 106, a magnetic recording layer 108, and an overcoat 110 (e.g., carbon overcoat and/or lubricating layer). One or more of these example layers, such as the interlayer 106 and magnetic recording layer 108, can comprise several thin-film layers and/or spacer layers. Thus, it can be seen that fabrication of a single recording medium 100 can involve a number of processing steps (e.g., 4-24+ steps). Reducing the amount of time it takes to cool a disk between steps, such as prior to applying the overcoat 110, can significantly increase the production throughput/output rate. Improving the cooling efficiency can also increase the quality of the carbon overcoat by allowing for the carbon overcoat to be deposited at lower process temperatures than are currently used. One way to implement such a reduction in cooling time is through a redesign of cooling station equipment.

In one approach, a disk (e.g., recording medium) is introduced to a cooling station and cooling structures (e.g., plates) are dynamically moved as close as possible to the opposing sides of the disk. The closer proximity the cooling plates are to the disk, the faster the disk cools. However, moveable cooling plates complicates the cooling dynamics, increases the complexity of the cooling station mechanics, and decreases the reliability of the cooling operation. Embodiments herein address a cooling station with static cooling plates set at a predetermined distance from each other. The fixed plate spacing trades a lower cooling rate for increased reliability and repeatability in the cooling operation. The static plates also remove uncertainty of the cooling structure proximity to the media and operation complications. However, the static cooling plates use a higher cooling gas pressure to compensate for the increased distance from the disk. Embodiments described herein enable local volume reduction (i.e., proximate the disk) using one or more isolation valves integrated with the cooling plates. The reduced cooling chamber volume provides higher pressure with less gas. The higher pressure represents more gas collisions with the disk and cooling structures, which leads to increased heat transfer. Since the cooling gas is typically a light gas (e.g., helium or hydrogen), it can be difficult to remove from the chamber (i.e., pump out). In certain embodiments, the cooling gas may include a blended gas such as a combination of helium or hydrogen with another, heavier gas. However, less gas used for the smaller chamber volume during the cooling process leads to faster fill and pump out times, which increase cooling efficiency.

Figure 2A:
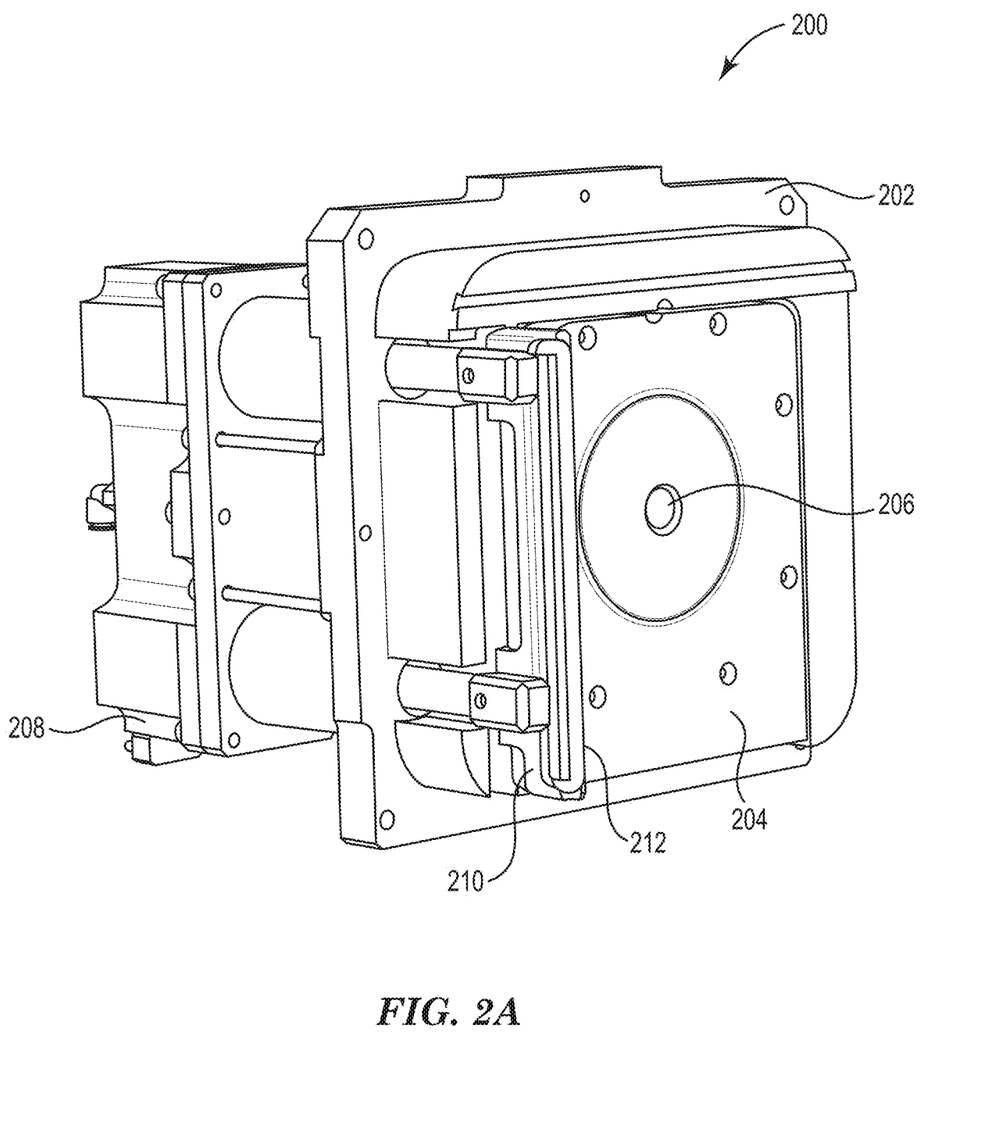
FIG. 2A is a perspective view of one cooling unit according to embodiments discussed herein.

Turning to FIG. 2A, a first cooling unit 200 is shown in perspective. The cooling unit includes a frame 202 configured to hold a cooled structure 204. The cooled structure can take any variety of shapes, but it is typically a plate shape with opposing first and second, relatively planar surfaces. While the cooled structure 204 is shown as a square, the structure could also have any variety of circumferential shapes such as a circle, triangle, rectangle, etc. The cooled structure can also comprise a variety of materials capable of cooling to temperatures lower than about 20° C., or to sustain cryogenic cooling (e.g., 20° C. down to −196° C.). Examples of such materials include copper, aluminum, gold, and other high thermal conductivity metals. Proximate the center of the cooled structure 204 is a gas injection aperture 206. The cooled structure can include additional and/or alternately located gas injection locations.

Integrated with the frame 202 is a slidable sealing structure 208, e.g., an isolation valve. A first end of the sealing structure 208 includes a blade 210. The blade 210 can comprise a variety of sizes and shapes, but typically it is elongated to block an opening to a cooling station shaped like a slot. The sealing member 210 can also include a gasket 212. The gasket 212 may, for example, be an O-ring. An opposing end of the sealing structure 208 includes components for controlling the sealing structure 208, such as a controller or circuitry for an actuator.

Figure 2B:
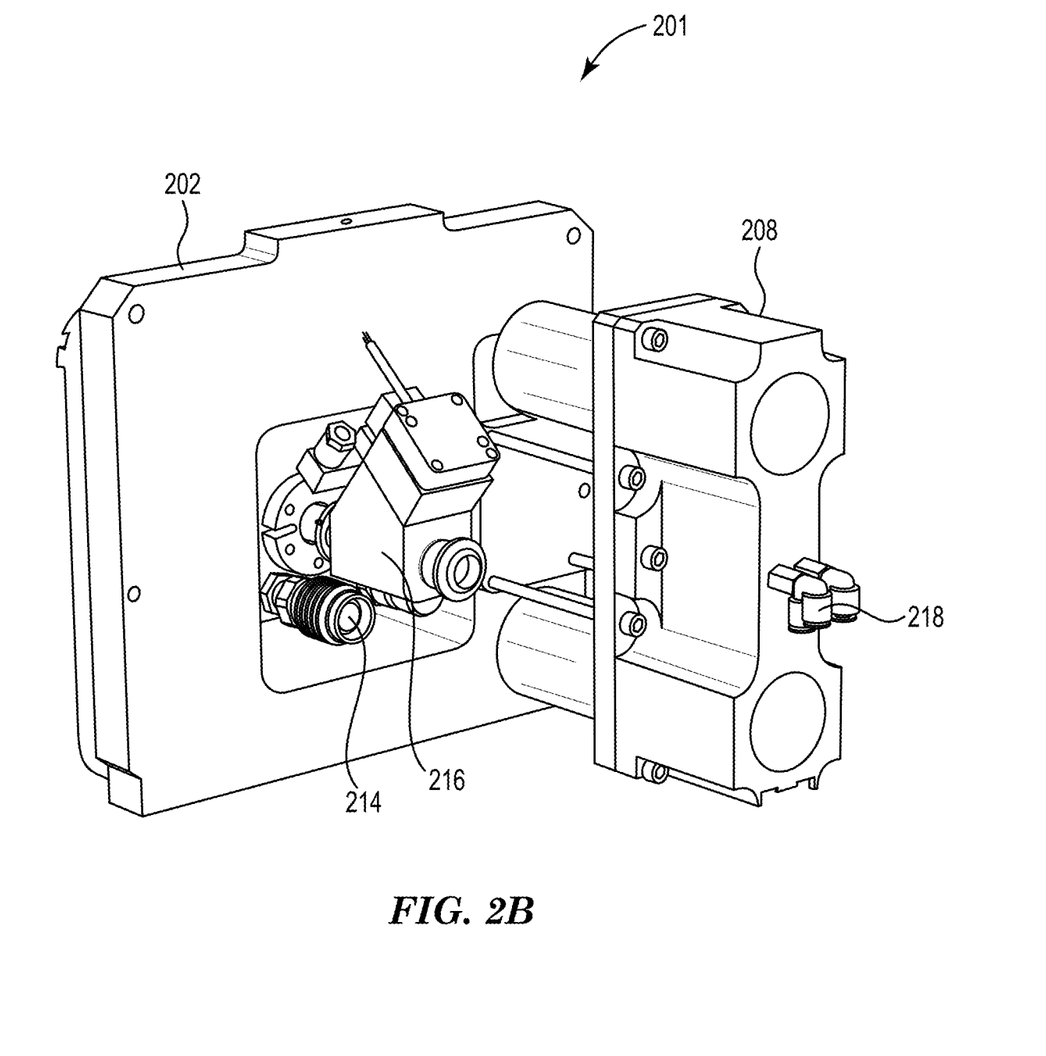
FIG. 2B is a perspective view of a second cooling unit configured to mate with the cooling unit of FIG. 2A according to embodiments discussed herein.

A second cooling unit 201 configured as a mirror image of and configured to mate with, the cooling unit of FIG. 2A, is shown in FIG. 2B. Cooling unit 201 also includes a frame 202 configured to hold a cooled structure. Here, the opposing, back, side of the cooled structure is shown. An opening in the frame 202 provides access to the cooled structure for coupling at least one cooling fluid fitting 214 and one or more gas inlet valves 216 to the cooled structure. As discussed above, the gas inlet valve 216 is positioned proximate the center of the cooled structure for injection of the cooling gas proximate the center of a disk being processed. The cooling fluid fitting 214 can be coupled via one or more lines to equipment for cooling the cooled structure. The cooling fluid can be a variety of cooling fluids including water or cryogenic materials such that in certain embodiments, the cooling equipment performs cryogenic cooling and includes a compressor, reservoir, controller, etc.

As with the first cooling unit 200, the cooling unit 201 includes a slidable sealing structure 208, e.g., an isolation valve, integrated with the frame 202. Here, the end opposing the sealing blade is shown. As discussed above, the slidable sealing structure may include components for controlling the sealing structure 208, such as connections for coupling to electronic circuitry and/or one or more fluid connections 218. The actuator for the slidable sealing structure may be a variety of valve controls including a servo or stepper driven linear stage, and a dual piston pneumatic valve actuator, as shown. The mating of units 200 and 201 of FIGS. 2A-B is shown in FIG. 3.

Figure 3:
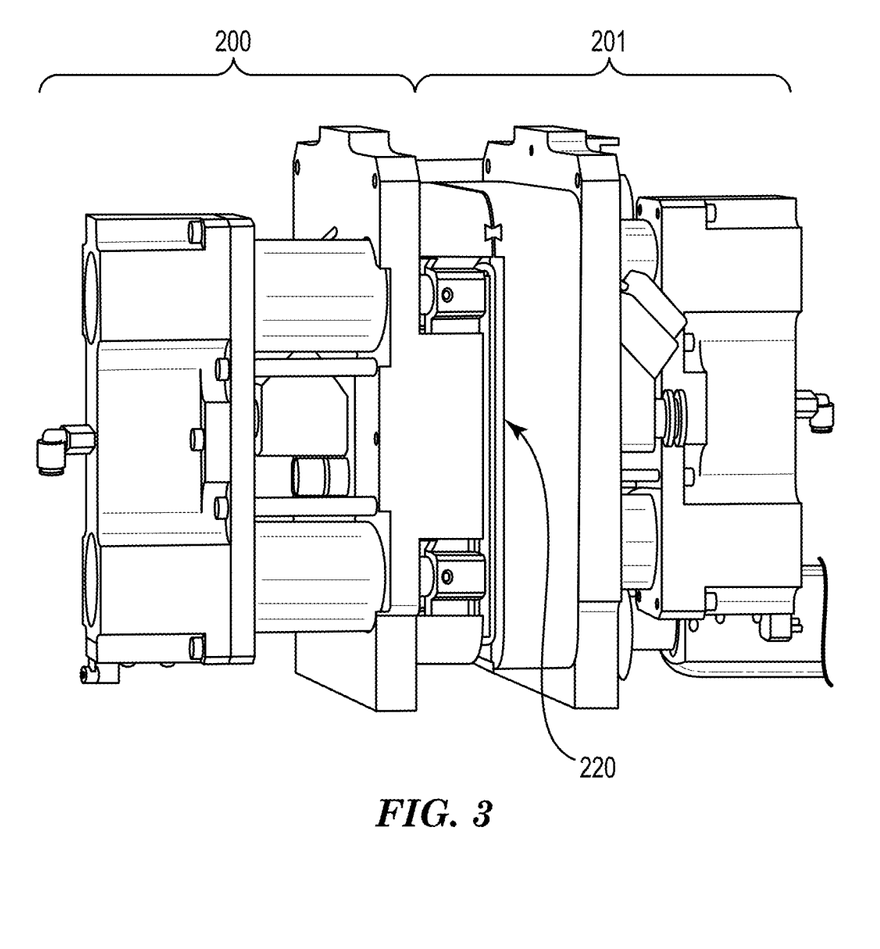
FIG. 3 is a perspective view of the mated cooling units of FIGS. 2A-B according to embodiments discussed herein.

In FIG. 3, the first cooling unit 200 is shown mated with the second cooling unit 201 to form a cooling chamber. As shown, the respective sealing blades of the units 200, 201 are positioned opposite each other to seal opposing sides of the chamber. For example each sealing blade contacts the frame 202, or cooled structure, of the opposing cooling unit to form a seal in a closed position. Arrow 220 indicates that the sealing blade is activated and a sealed chamber is shown. Activation of the respective slidable sealing structures is typically controlled by electronic circuitry using one or more of a controller, programmer, memory, and a user interface. For example, a user interface can illustrate the positions/status of the sealing blades (e.g., open/closed) and those positions can be controlled via the user interface. The cooling units 200, 201 are further contained within a housing forming a cooling station and discussed further below.

Figure 4A:
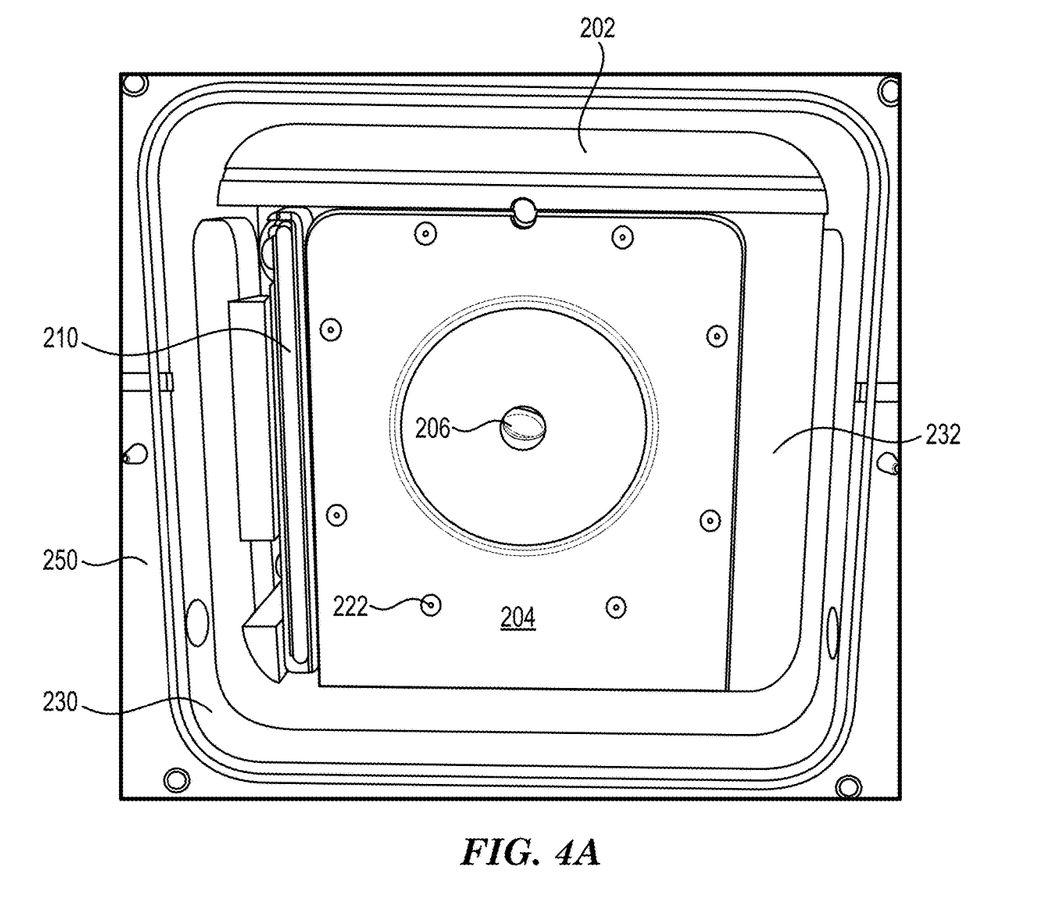
FIG. 4A is a front view of a cooling plate according to embodiments discussed herein.

FIG. 4A illustrates a cooling unit installed in a cooling station housing 250. A second cooling unit is removed to show the inside of the cooling station chamber 230. As can be seen, one wall of the chamber is formed by a cooled structure 204, such as a cooling plate. The cooling plate is coupled to a frame 202 and/or cooling fluid/gas injection equipment by fasteners 222 (e.g., screws, bolts, etc.). A cooling gas injection aperture 206 is positioned proximate the center of the cooled structure 204 for injecting cooling gas proximate the center of a disk when the disk is introduced to the chamber 230. At one side of the cooled structure 204, a sealing blade 210 is positioned so that when in a closed position, the chamber 230 is sealed. As shown, the sealing blade 210 is in an open position, and when activated, the blade 210 slides forward to the closed/sealed position. A complementary sealing blade would also be integrated into the second cooling unit that is removed from the figure, such that in a closed position, the complementary sealing blade would seal the chamber by contacting the side of the frame 232 opposing sealing blade 210.

Figure 4B:
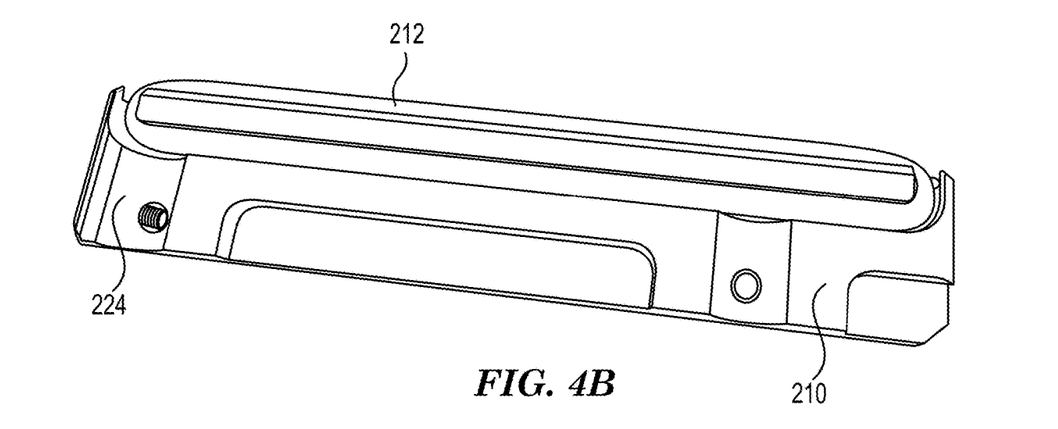
FIG. 4B is a perspective view of a sealing blade structure according to embodiments discussed herein.

In FIG. 4B, further details of the sealing blade 210 are shown. The blade 210 is formed in a rectangular plate shape; however, the blade could comprise various other shapes that would be configured to slide forward and seal an opening of a cooling station. Also, the blade 210 can be formed from variety of materials including metals and/or plastics that are configured to withstand the temperatures of the cooling station. The blade 210 is coupled to the rest of the sealing structure using integrated grooves and/or fasteners 224. However, the blade 210 could also be formed as a single, integrated member with the actuating components. The sealing edge of the blade 210 can also include a gasket 212, such as an O-ring. The gasket 212 can be formed from a variety of materials that are capable of withstanding the temperatures attained in the cooling chamber and is configured to engage with the shape of the blade 210.

Figure 5:
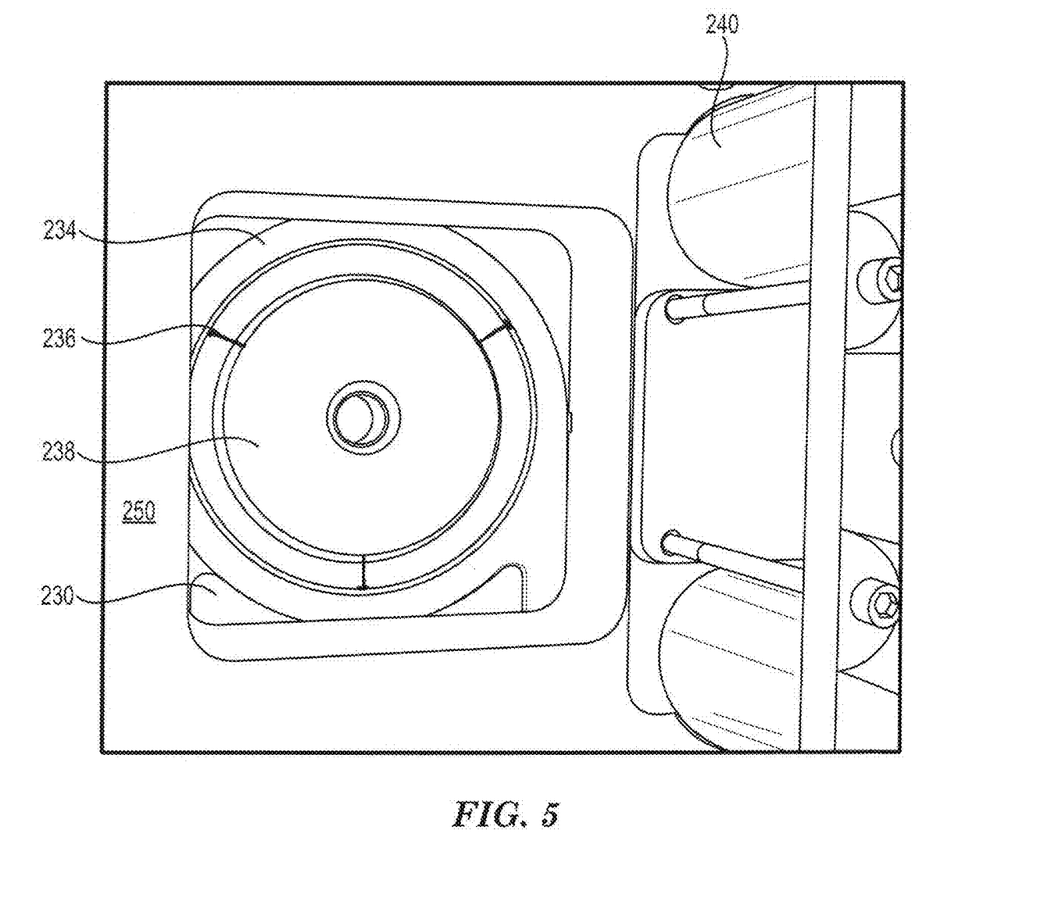
FIG. 5 is a front view of a recording medium in a carrier positioned within a cooling chamber with one cooling unit removed according to embodiments discussed herein.

In continuing to build the cooling station, FIG. 5 illustrates the cooling station of FIG. 4 with the addition of a carrier 234 holding a disk 238 present in the chamber 230. The disk 238 is held in place by support members 236. While three support members 236 are shown, there may be any number and they may comprise a variety of shapes and materials. The second cooled structure is still removed so as to provide a view into the chamber 230. Although the second cooled structure is removed, pistons 240 of the slidable sealing structure are shown integrated into the cooling station. As may be seen, the carrier 234 positions the disk 238 proximate the center of the cooled structure 204. With the gas injection aperture 206 positioned proximate the center of the cooled structure, the aperture 206 is also substantially aligned with the central hole of the disk 238. When the second cooling unit is present, a central gas injection aperture of the second cooled structure would align both gas injection ports with the center of the disk such that gas is injected toward the center of the disk from both sides.

Figure 6:
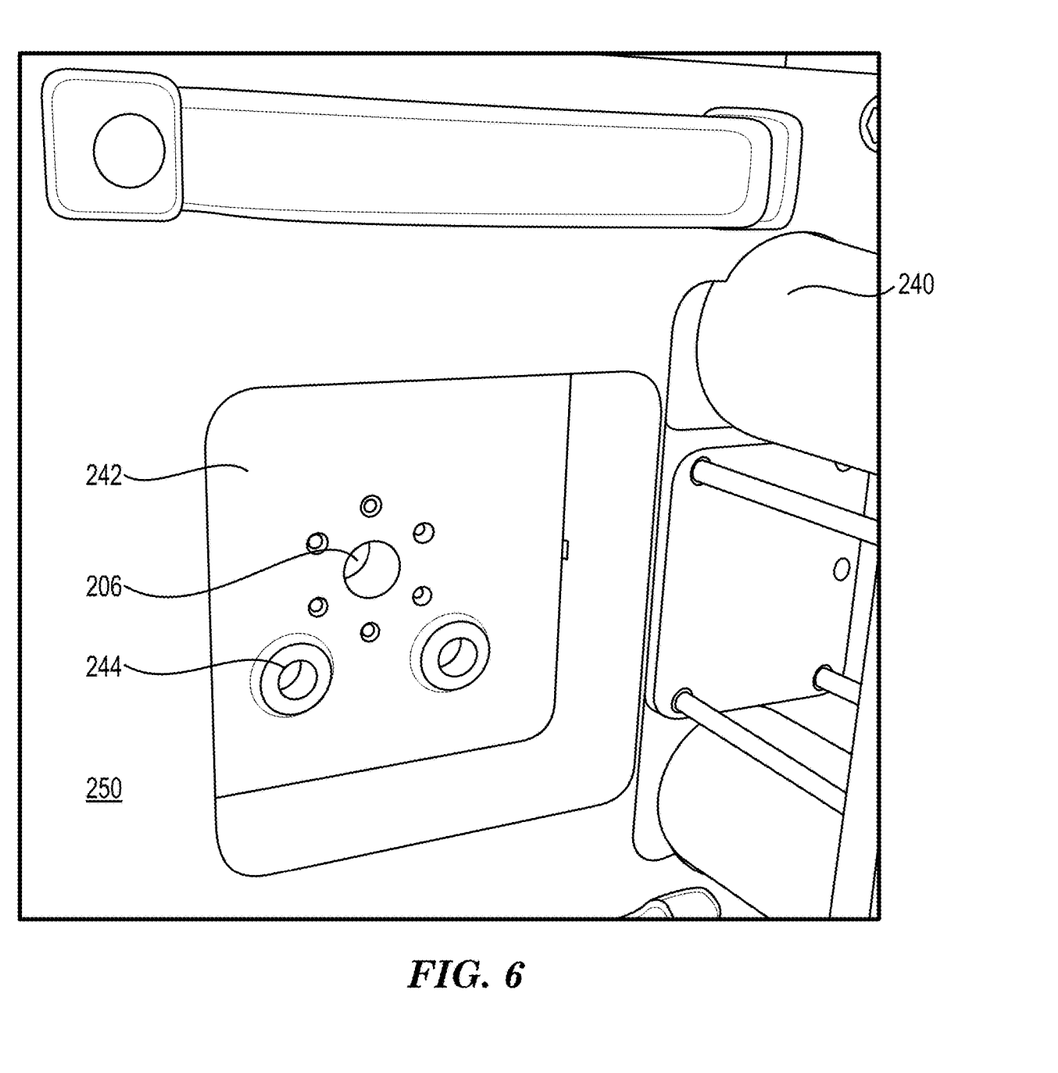
FIG. 6 is a back view of a cooling plate according to embodiments discussed herein.

In FIG. 6, the cooling station of FIG. 5 is shown with the second cooled structure 242 installed. The second cooled structure 242 forms a second wall of the chamber 230 and the back of the cooled plate is exposed for coupling to cooling and control equipment. For example, ports 244 couple to cooling fluid fittings 214 and the centrally positioned gas injection aperture 206 couples to at least one gas inlet valve 216 as shown, for example, in FIG. 2B. Since the cooled structures 204, 242 are static and form two walls of the chamber 230, the disk being processed enters the chamber 230 by indexing into the chamber 230 between the two cooled structures 204, 242.

The chamber 230 volume can be controlled by activating the slidable sealing structures 208 (e.g., isolation valves) located proximate, and integrated with, the cooled structures 204, 242. The slidable sealing structures 208 are configured to seal the openings 260 (i.e., entry and exit) forming the path of the carrier 234 through the cooling station. When the slidable structures are activated, the respective blades 210 contact the opposing frame 202 or cooled structure of the opposing cooling unit to complete/seal the chamber 230. Activating the slidable sealing structures to a closed position reduces the chamber volume, thereby facilitating faster cooling of the disk 238.

When a disk (e.g., recording medium) is being processed, it is positioned between two cooling structures, 204, 242 positioned substantially parallel to the each other and forming a gap between the two cooling structures. The gap is configured to receive the medium. The cooling structures comprise an enlarged portion (e.g., a plate or disk) coupled with respective cooling fluid fittings and cooling gas inlet valves. In certain embodiments, the cooling structures are plates that may correspond in size to the diameter of the medium being cooled. For example, the cooled plates may have a diameter of about 50-200 mm. For example, when the cooling station is designed to accommodate a variety of media sizes, the cooled plates may correspond to the largest size medium. The cooling plates remain static and are positioned as close as possible to the medium without contacting the medium. For example, each side of a medium may be within 0.1 mm to 1 cm of one of the cooling plates.

As discussed above, cooling gas is injected at least proximate the center of the disk 238 from one or both cooling units. However, there may also be additional gas injection locations in the chamber 230, such as from the top of the chamber or located radially about the disk. Since the slidable sealing structure blades are located proximate the cooling plates and the disk, the volume of the sealed chamber is not much larger than the disk itself. The small volume kept local to the disk increases the rate of heat transfer by keeping the cooling gas proximate the disk. The plurality of sealing surfaces dictates gas dynamics in the chamber 230. For example, the sealing blades 210 operate both to confine the gas volume in the chamber 230 as well as to deflect/reflect gas in the chamber back toward the disk 238.

The injected gas increases the pressure in the chamber 230 and cools the medium via free molecular regime convection. In the chamber 230, convection is governed by molecular regime kinetic gas theory. The corresponding heat transfer is defined by Kennard's law, $\dot{Q}=A_1*\alpha(T)*\Omega*p*(T_2-T_1)$, where p represents pressure such that the higher the pressure, the more heat transfer occurs (i.e., higher pressure leads to increased cooling rate). Once the medium temperature drops a predetermined amount, or reaches a predetermined temperature, the slidable sealing structures are moved to an open position to unseal the chamber 230. While the sealing blades can be activated in unison, they can also be activated independently. A pyrometer (not shown) is mounted to an inner wall of the chamber 230 to optically measure the disk temperature as the disk leaves the cooling station. Alternatively, a thermal sensor (e.g., another pyrometer) may be positioned to monitor the disk cooling in situ for real-time closed loop cooling control. Pumps coupled to the cooling station remove the injected gas from the cooling station chamber. In certain embodiments, pumps operate during continuous gas flow injection rather than starting and stopping for a static gas pressure mode. Each of the small chamber volume, close positioning of the cooling structure plates to the medium, and central injection of the cooling gas contribute to a decreased amount of time the medium spends within the cooling station. When this increased cooling rate corresponds to a shortened amount of cooling processing time, the disk production rate is increased.

Figure 7A:
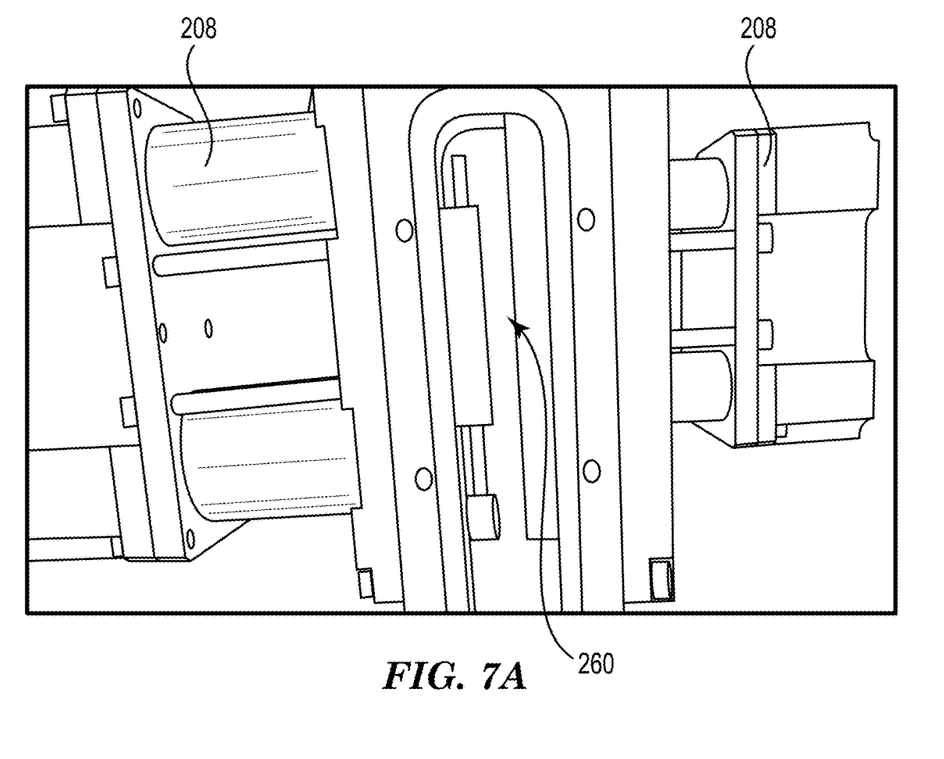
FIG. 7A is a front view of an opening to a cooling station with an empty chamber according to embodiments discussed herein.
Figure 7B:
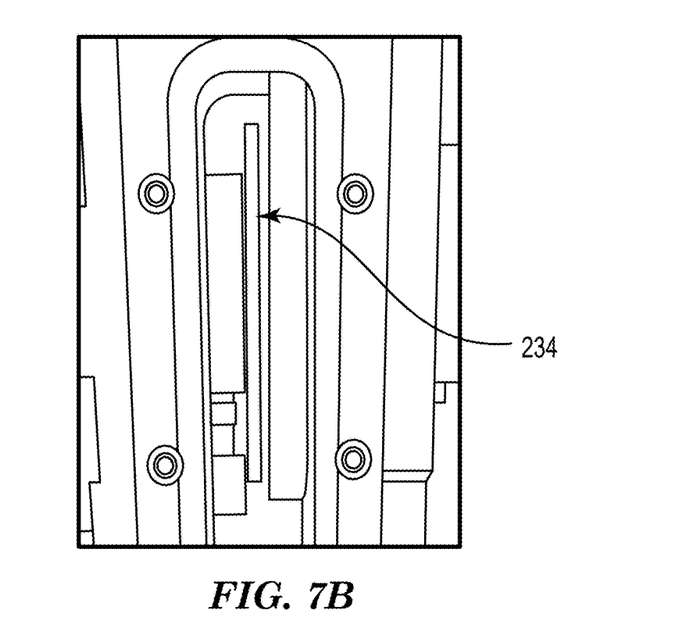
FIG. 7B is a front view of the opening to the cooling station of FIG. 7A with a medium positioned in the chamber.

FIGS. 7A-B illustrate the opening 260 where the carrier 234 enters the cooling station. The opening 260 as illustrated has a vertical orientation (e.g., a slot opening), which can facilitate disk transport through a fabrication process/machinery and provides a compact chamber design; however, the opening 260 can be oriented at a variety of angles, including horizontal or perpendicular to the orientation shown. The opening 260 can also be adjustable to accept varying sizes of recording media (e.g., disks of varying diameters). In FIG. 7A, the chamber 230 is empty, and in FIG. 7B, the chamber is occupied by a disk, prior to the slidable sealing structures 208 being activated. As may be seen, disk 238 (e.g., installed in a carrier 234) enters the cooling station through opening 260 and then may exit the cooling station through a corresponding opening on the opposite side of the chamber 230. Alternatively, the disk can index out of the same slot 260.

Figure 8:
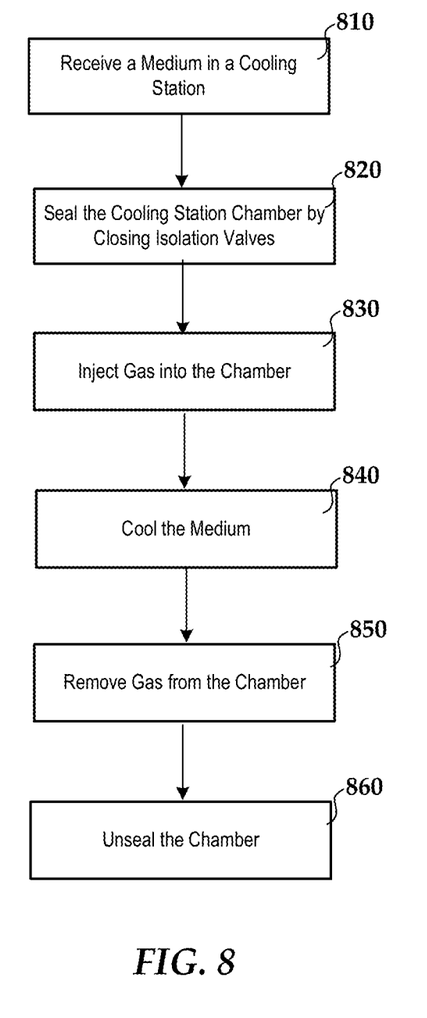
FIG. 8 is a flow diagram illustrating a cooling process, according to embodiments discussed herein.

FIG. 8 is a flow chart illustrating a method of cooling a recording medium using a cooling station according to embodiments described herein. The method involves receiving a recording medium, e.g., a disk that is in the process of being fabricated, in a cooling station 810. As discussed above, the medium typically indexes into the cooling station housed in a carrier in a vertical orientation after a processing step involving high temperatures (e.g., above $T_C$). Within the cooling station, the medium is positioned between two cooling plates that are held static and at a predetermined distance from each other (e.g., while still being as close to the medium as possible).

After insertion of the medium, the cooling station chamber is sealed 820 by closing the isolation valves on each side of the medium and the chamber. As shown above, the isolation valves slide forward to engage an opposing cooling unit, e.g., sealing both ends of the medium's pathway through the cooling station. Including the insertion and removal of the medium from the cooling station, the steps described herein can be automated and controlled by computer circuitry for efficiency. However, the steps may also be conducted by hand. The isolation valves are positioned proximate the cooling plates such that sealing the chamber reduces the chamber volume. Next, gas is introduced, e.g., injected, into the chamber 830. While various gasses can be used, helium, hydrogen, and other typical cryogenic gasses (e.g., gas blends) are preferred. The gas is injected between the cooling plates proximate the medium, preferably at a position proximate the center of the medium. For example, the gas is injected through the center of each cooling plate on either side of the medium forcing the gas out from the center. The gas is confined around the medium by the isolation valves. Introduction of the gas raises the pressure in the chamber and allows for kinetic gas regime molecular flow convection.

The medium is then cooled 840. The temperature of the medium may be measured, or continually monitored, and when the medium temperature is reduced, e.g., by a predetermined amount, the gas is removed from the chamber 850. The medium temperature reduction can be determined by the medium reaching a predetermined/specified temperature, the medium temperature being below a threshold, or the medium temperature experiencing a predetermined change (e.g., a predetermined temperature delta). Alternatively, the temperature may not be measured directly. With various parameters being known (e.g., initial medium temperature, cooling plate temperature, pressure, etc.), the medium may be processed in the cooling station for a predetermined amount of time calculated to correspond to a desired final medium temperature. When cooling based on a predetermined amount of time, the medium temperature can be checked and/or verified by a pyrometer as the medium indexes out of the cooling station. Cooling the medium in the sealed chamber described herein can expose the disk to the cooling gas flow for as long as necessary to meet media performance/production demands. The cooling station chamber is then unsealed by opening the isolation valves 860. The medium is typically then transferred to a subsequent processing station (e.g., application of a carbon overcoat). Increasing the amount of time the disk is exposed to the cooling gas flow, increases the cooling rate and efficiency of the cooling station.

It is to be understood that even though numerous characteristics of various embodiments have been set forth in the foregoing description, together with details of the structure and function of various embodiments, this detailed description is illustrative only, and changes may be made in detail, especially in matters of structure and arrangements of parts illustrated by the various embodiments to the full extent indicated by the broad general meaning of the terms in which the appended claims are expressed.

What is claimed is:

1. An apparatus, comprising:
a chamber configured to receive a medium, the chamber comprising:
a first cooled structure having a first surface, wherein the first cooled structure forms a first wall of the chamber;
a second cooled structure having a first surface, wherein the second cooled structure forms a second wall of the chamber opposing the first wall and the first surface of the first cooled structure faces the first surface of the second cooled structure and is positioned a predetermined distance therefrom forming a gap and the gap is configured to receive the medium;
a first gas inlet positioned proximate the center of the first cooled structure;
a first slidable structure configured to extend beyond the first surface of the first cooled structure toward the first surface of the second cooled structure to seal a first side of the chamber when in a closed position; and
a second slidable structure, positioned opposite the first slidable structure and configured to extend beyond the first surface of the second cooled structure toward the first surface of the first cooled structure to seal a second side of the chamber when in a closed position.

2. The apparatus of claim 1, wherein the first slidable structure is controlled by a first dual piston pneumatic actuator and the second slidable structure is controlled by a second dual piston pneumatic actuator.

3. The apparatus of claim 1, wherein the first and second slidable structures each comprise a sealing blade.

4. The apparatus of claim 3, wherein the sealing blades each comprise an O-ring.

5. The apparatus of claim 1, wherein the first slidable structure is coupled to the first cooling structure and the second slidable structure is coupled to the second cooled structure.

6. The apparatus of claim 1, wherein the first and second cooled structures are static in the apparatus.

7. The apparatus of claim 1, wherein the first and second cooled structures are cryogenically cooled.

8. The apparatus of claim 1, further comprising:
a second gas inlet positioned proximate the center of the second cooled structure.

9. The apparatus of claim 1, wherein the first and second slidable structures are activated in unison.

10. The apparatus of claim 1, wherein the first and second slidable structures define a transport path for the medium through the apparatus when the first and second slidable structures are both in an open position.

11. An apparatus, comprising:
a first unit, comprising:
a first cooling plate having a cooling surface;
a first gas inlet; and
a first slidable sealing structure adjacent the first cooling plate configured to extend beyond the cooling surface of the first cooling plate; and
a second unit, comprising:
a second cooling plate having a cooling surface;
a second gas inlet; and
a second slidable sealing structure adjacent the second cooling plate configured to extend beyond the cooling surface of the second cooling plate, wherein the second unit is configured as a mirror opposite of the first unit and the first and second units are statically positioned with the cooling surfaces facing each other a predetermined distance apart and the first slidable sealing structure couples to the second unit and the second slidable sealing structure couples to the first unit when the first and second slidable structures are in an extended position.

12. The apparatus of claim 11, wherein the first gas inlet is positioned proximate the center of the first cooling plate and the second gas inlet is positioned proximate the center of the second cooling plate.

13. The apparatus of claim 11, wherein the first unit comprises a first dual piston pneumatic actuator configured to control the first slidable sealing structure and the second unit comprises a second dual piston pneumatic actuator configured to control the second slidable sealing structure.

14. The apparatus of claim 11, wherein the first and second slidable sealing structures each comprise a sealing blade.

15. The apparatus of claim 11, wherein the first and second cooling plates are cryogenically cooled.

16. The apparatus of claim 14, wherein the first and second sealing blades each comprise a gasket.

17. The apparatus of claim 11, wherein the first and second slidable sealing structures are activated in unison.

18. The apparatus of claim 11, wherein the first and second slidable sealing structures define a transport path for a medium through the apparatus when the first and second slidable sealing structures are both in an open position.

19. The apparatus of claim 11, wherein the predetermined distance between the first and second units forms a gap configured to receive a recording medium substrate.

\* \* \* \* \*